United States Patent [19]

Hiwatashi

[11] Patent Number: 4,823,276

[45] Date of Patent: Apr. 18, 1989

[54] COMPUTER-AIDED AUTOMATIC WIRING METHOD FOR SEMICONDUCTOR INTEGRATED CIRCUIT DEVICE

[75] Inventor: Tamotsu Hiwatashi, Yokohama, Japan

[73] Assignee: Kabushiki Kaisha Toshiba, Kawasaki, Japan

[21] Appl. No.: 26,301

[22] Filed: Mar. 16, 1987

[30] Foreign Application Priority Data

Mar. 20, 1986 [JP] Japan .................................. 61-63215

[51] Int. Cl.⁴ ............................................ G06F 15/60
[52] U.S. Cl. .................................... 364/491; 364/490; 364/489; 364/488
[58] Field of Search ................ 364/488, 489, 490, 491, 364/300

[56] References Cited

U.S. PATENT DOCUMENTS

| | | | |
|---|---|---|---|
| 4,577,276 | 3/1986 | Dunlop et al. | 364/491 |
| 4,613,941 | 9/1986 | Smith et al. | 364/490 |
| 4,630,219 | 12/1986 | Di Giacomo et al. | 364/489 |
| 4,754,408 | 6/1988 | Carpenter et al. | 364/491 |

FOREIGN PATENT DOCUMENTS 0145925  6/1985  European Pat. Off. ............ 364/491

OTHER PUBLICATIONS

"Computer-Aided Wiring Designs", by J. L. Kallas, Bell Laboratories Record, Nov. 1964, pp. 343-349.
"Theory and Concepts of Circuit Layout", by T. C. Hu et al., IEEE Press, Jan. 1985, pp. 3-18.
"An Over-Cell Gate Array Channel Router", by H. E. Krohn, IEEE 20th Design Automation Conference, 1983, pp. 665-670.
"Automatic Placement and Routing of Gate Arrays", by G. Robson, VLSI Design, vol. V, No. 4, Apr. 1984, pp. 35-43.
IEEE 19th DA Conf., pp. 46-50, A New Two-Dimensional Routing Algorithm; C. P. Hsu; 1982.
IEEE Proceedings of ICC-D, pp. 468-471, Rectilinear Area Routing: A Channel Router Approach; J. A. Hudson et al., 1985.
IEEE Proceedings of ISCAS, pp. 29-30, A New Routing Region Definition and Ordering Scheme Using L Shaped Channels, W. Dai et al., 1985.

Primary Examiner—Parshotam S. Lall
Assistant Examiner—V. N. Trans
Attorney, Agent, or Firm—Oblon, Fisher, Spivak, McClelland & Maier

[57] ABSTRACT

A computer-aided automatic wiring method is disclosed, which determines a wiring pattern for a semiconductor IC device in which function blocks are arranged on a substrate and channel are defined around the blocks to serve as wiring regions. First, electrical connecting paths between associated blocks at one channel (a first channel) are determined to obtain a normal wiring pattern in accordance with a bonding request. Subsequently, if another channel (a second channel) already subjected to normal wiring is present among channels adjacent to the first channel, these channels are merged before the next channel is subjected to normal wiring so as to define a new expanded channel (a third channel). A combined wiring pattern of the third channel, obtained simply by combining wiring patterns of the first and second channels, is then modified conform to the shortest routing rule. If a vacant space is found in the modified wiring pattern, the space is removed to reduce the size of the third channel. The processing is repeatedly executed with respect to every channel, thereby optimizing the entire wiring pattern of the IC device to maximize its packing density.

11 Claims, 4 Drawing Sheets

F I G. 3
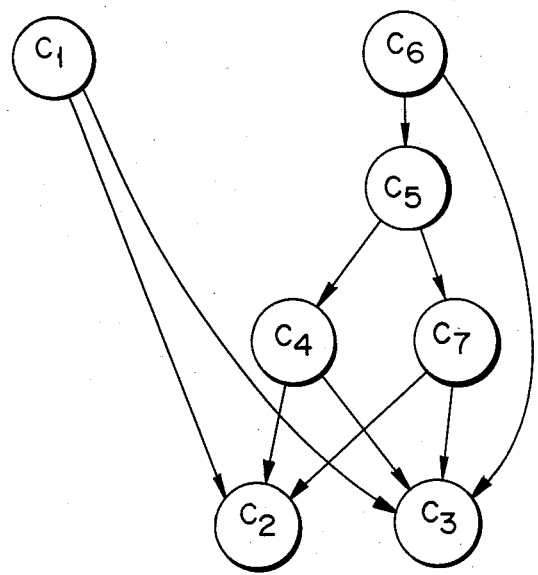

COMPUTER-AIDED AUTOMATIC WIRING METHOD FOR SEMICONDUCTOR INTEGRATED CIRCUIT DEVICE

BACKGROUND OF THE INVENTION

The present invention relates to an automatic wiring method for a semi-custom semiconductor circuit device and, more particularly, to a computer-aided automatic wiring pattern design method for forming wiring paths between a plurality of function circuit blocks selected to obtain a desired LSI circuit function on a chip substrate in accordance with a predetermined routing scheme.

Unlike a full-custom LSI (large-scale integrated circuit), the importance of a semi-custom LSI has recently increased for semiconductor manufacturers because of its short development period, superior flexibility for realizing various LSI specifications, and relatively low manufacturing cost. A building block type or general cell type LSI is a typical semi-custom LSI wherein a plurality of selected function circuit blocks (which are also called "modules") such as a CPU (central processing unit), an ALU (arithmetic logic unit), a PLA (programmable logic array), a RAM (random access memory), a ROM (read only memory), or a polycell unit are discretely arranged on a semiconductor chip substrate. A proper wiring pattern consisting of partial lines (trunks) which run along the row and column directions (X and Y directions) of the substrate is added in a substrate wiring region defined to surround these function blocks, and an electrical wiring is performed between function blocks for desired functions.

Conventionally, according to the semi-custom LSI of this type, a computer-aided routing design method may be adopted to determine the wiring pattern for electrical connections between the above function blocks. For example, when a channel wiring method is adopted to design the above wiring pattern, a wiring region is divided into a plurality of sub-wiring regions (which are known as "channels" to those skilled in the art) so as to correspond to the function blocks arranged on the substrate. Since each function block generally has a rectangular shape on the substrate, each sub-wiring region, i.e. channel, is defined to have a flat rectangular shape so as to be located adjacent to the corresponding function block. Therefore, adjacent channel regions on the substrate contact each other through a linear boundary. The allowable number of wires (tracks) extending along the row and column directions, which can be formed in each channel, is determined in correspondence to the surface area of each channel. In order to satisfy the above requirement for track numbers and simultaneously to minimize the length of each wire, the wiring pattern required to realize the desired LSI functions is determined independently for each channel.

For example, a wiring pattern in a channel between a function block and other associated function blocks is designed in such a manner that terminals of the function block are correctly connected to the corresponding terminals of the associated function blocks. In this case, the allowable track number in the above channel is normally taken into consideration, and each connection wire is constituted by a plurality of partial lines extending along the row and column directions. The row and column lines are respectively formed in two conductive layers stacked to be electrically insulated from each other, and connections at necessary positions therebetween are performed through contact holes. When determination of the wiring pattern in one channel is completed, a wiring pattern of another channel adjacent thereto is then determined in the same manner.

According to the conventional automatic wiring design method described above, however, it is very difficult to improve packing density of the resultant semi-custom LSI to a desired extent. This is because an independent wiring pattern in each channel region is simply repeatedly designed so that wiring density in the channel largely varies for each channel region, resulting in a non-effective use of the channel region. In the LSI thus obtained, if a space which does not contribute at all to wiring pattern formation (and which tends to be formed often especially at portions where channels contact each other) is left in the channel region, packing density of the LSI is naturally reduced.

SUMMARY OF THE INVENTION

It is therefore an object of the present invention to provide a new and improved automatic wiring method for a semiconductor integrated circuit device, which can effectively utilize channels for wiring between function blocks, thereby largely contributing to an improvement in packing density of the semiconductor integrated circuit device.

In accordance with the above object, the present invention is addressed to a specific computer-aided automatic wiring method, which determines a wiring pattern for a semiconductor integrated circuit device wherein function blocks, selected to obtain desired logical functions, are arranged on a substrate, and channels are defined therearound to serve as wiring regions. First, in one channel (a first channel) selected in accordance with a predetermined processing order, electrical connection paths between associated function blocks are determined in accordance with a bonding request to obtain a normal wiring pattern. Subsequently, among channels adjacent to the above first channel subjected to wiring, another channel (a second channel) already subjected to normal wiring in the same way is detected. The second channel has a processing order immediately before the processing order of the first channel. At this time, before the next channel is subjected to normal wiring, the first and second channels are merged to form a new channel (third channel), an area of which is expanded.

At this time, the above third channel has a combined wiring pattern obtained by simply combining wiring patterns of the first and second channels. Subsequently, the above combined wiring pattern, obtained by simply combining the wiring patterns of the first and second channels, is modified in an expanded space of the third channel to match with a minimal routing rule. It is verified whether a vacant space, which does not contribute to wiring, is left in the modified wiring pattern of the third channel. If a vacant space is detected, it is removed to reduce the size of the third channel, thus optimizing the entire wiring pattern of the finally obtained semiconductor integrated circuit device and maximizing its packing density.

The invention, and its objects and advantages, will become more apparent in the detailed description of a preferred embodiment presented below.

BRIEF DESCRIPTION OF THE DRAWINGS

In the detailed description of a preferred embodiment of the invention presented below, reference is made to the accompanying drawings in which:

FIG. 3 is a diagram visually showing priority (a processing order) for executing wiring of a plurality of divided channel regions defined between function blocks arranged on a chip substrate.

DETAILED DESCRIPTION OF THE PREFERRED EMBODIMENT

Figure 1:
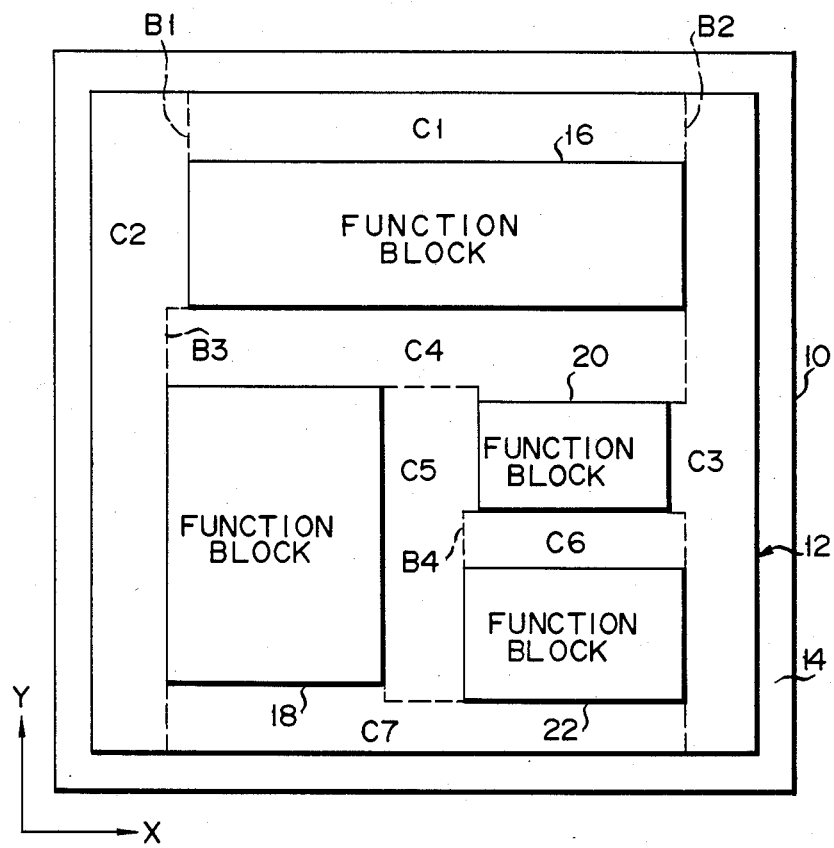
FIG. 1 is a diagram schematically showing a plan view of a building block type (or a general cell type) semi-custom logic LSI according to a preferred embodiment of the present invention.

FIG. 1 schematically illustrates a building block type (or a general cell type) logic LSI device according to an embodiment of the present invention. It is well known that semiconductor chip substrate 10 for the logic LSI has a flat rectangular shape. The top surface of substrate 10 is divided into rectangular main circuit region 12, which is located at its center, and input/output circuit region 14, which is located at its periphery so as to surround region 12.

Various kinds of function blocks (which are also called "modules") 16, 18, 20, and 22, required to obtain the desired LSI functions for a customer, are arranged on region 12 of substrate 10. Although FIG. 1 shows only four function blocks for illustrative simplicity, actually, more function blocks are discretely arranged on substrate 10. Blocks 16, 18, 20, and 22 may include a CPU (central processing unit), an ALU (arithmetic logic unit), a PLA (programmable logic array), and/or a RAM (random access memory) and a ROM (read only memory) in accordance with predetermined LSI functions. Blocks 16, 18, 20, and 22 may be constituted by a polycell.

A surface region of region 12 of substrate 10 surrounds blocks 16, 18, 20, and 22, and serves as a wiring region for providing wiring for electrically connecting blocks 16, 18, 20, and 22. Therefore, a proper wiring pattern, consisting of a plurality of partial lines extending along the row and column directions (X and Y directions), is added in the substrate wiring region, thereby forming desired LSI functions on substrate 10.

The substrate wiring region is divided into a plurality of (substantially rectangular) sub-wiring regions in correspondence to a planar arrangement of blocks 16, 18, 20, and 22. These sub-wiring regions are called "channels" in the following description, in accordance with a convention of the field of art. According to this example, seven channels C1, C2, ..., and C7 are defined around blocks 16, 18, 20, and 22, as shown in FIG. 1. Channels C1, C2, ..., and C7 have substantially rectangular planar shapes and contact each other through boundaries (which are also called "envelopes") indicated by broken lines in FIG. 1.

The wiring region on substrate 10 is divided into channels C1, C2, ..., and C7 by extending an edge line of each block and utilizing intersections of extended edge lines of the adjacent blocks. For example, first channel C1 is defined by utilizing the extensions of two vertical edge lines B1 and B2 of block 16. On the other hand, boundary B3 of channels C2 and C4 is formed using an extension of a lower horizontal edge line of block 16 and an extension of a left vertical edge line of block 18. In this manner, a reasonable number of channels are formed in accordance with the number of blocks arranged on substrate 10.

Although not illustrated in FIG. 1, each block has a plurality of signal input/output terminals to be connected to another block or blocks. Since interconnections between associated blocks through these terminals are determined in accordance with a circuit bonding, based on the final desired LSI specification, realization of the bonding pattern on substrate 10 is a main subject of the automatic wiring method of the present invention. The automatic wiring method will be described below in detail with reference also to the flowchart shown in FIG. 2.

First, proper wiring priority among channels C is determined, and a first channel, corresponding to a function block serving as a determination object of the wiring pattern, is specified. The proper wiring order of channels C is determined in accordance with a bonding request between blocks. For example, in FIG. 1, wiring from channels C2 to C4 must be executed after wiring at channel C1 is executed. This is because wiring from channels C2 to C4 depends on the result of wiring at channel C1, so that wiring conditions such as the number of tracks and a channel width cannot be determined if wiring at channel C1 is not completed. For a similar reason, wiring at channels C3 and C5 must be executed after wiring at channel C6 is executed. The order of wiring from channels C1 to C7, which is optimally determined in accordance with the above consideration, is shown in FIG. 3 as a tree structure. Within a range which satisfies the above condition, i.e., unless the execution order indicated by the arrows is reversed, the order of wiring from channels C1 to C7 can be freely determined. For example, it may be arbitrarily determined which one of channels C1 and C6, having the same order levels, is subjected to wiring first. According to this embodiment, channel C6 is specified as a channel to be subjected to wiring first. Thereafter, wiring is sequentially executed in accordance with the order of C5→C4→C7→C1→C2→C3. Such a method of analyzing the order is substantially the same as a conventional one.

It should be noted that boundary lines B1, B2, B3, ..., between channels are not fixed beforehand but may be freely corrected, i.e., widened or narrowed in correspondence to a result of channel wiring which is executed in accordance with the order limitation shown in FIG. 3. Therefore, the final shape of the channel, which is previously subjected to wiring, is determined prior to others.

According to the wiring method of the present invention, after normal wiring is performed for each channel, another channel or channels, which are adjacent to the above channels and already subjected to wiring, are merged with the above channels, and an adjusting processing (modification or rearrangement) for optimizing the wiring is performed in a new channel region consisting of merged channels. More specifically, a channel once subjected to normal wiring is, if a channel already subjected to wiring is present among adjacent channels, merged with the channel to form a new expanded (i.e., the area of which is widened) channel. Since the new expanded channel has a wiring pattern obtained by simply combining wiring patterns independently determined for the respective channels included in the new channel, the new channel as a whole does not effectively satisfy a "shortest wiring condition" and a "smallest area condition" and hence is not always optimal. On the contrary, it generally has a vacancy in terms of wiring efficiency. Therefore, the above-mentioned adjusting processing for optimizing the wiring is performed for the merged new channel region to remove any vacant space left in the expanded channel region, thereby maximizing the efficiency of the wiring in the channel region.

Normal Wiring Step

Figure 2:
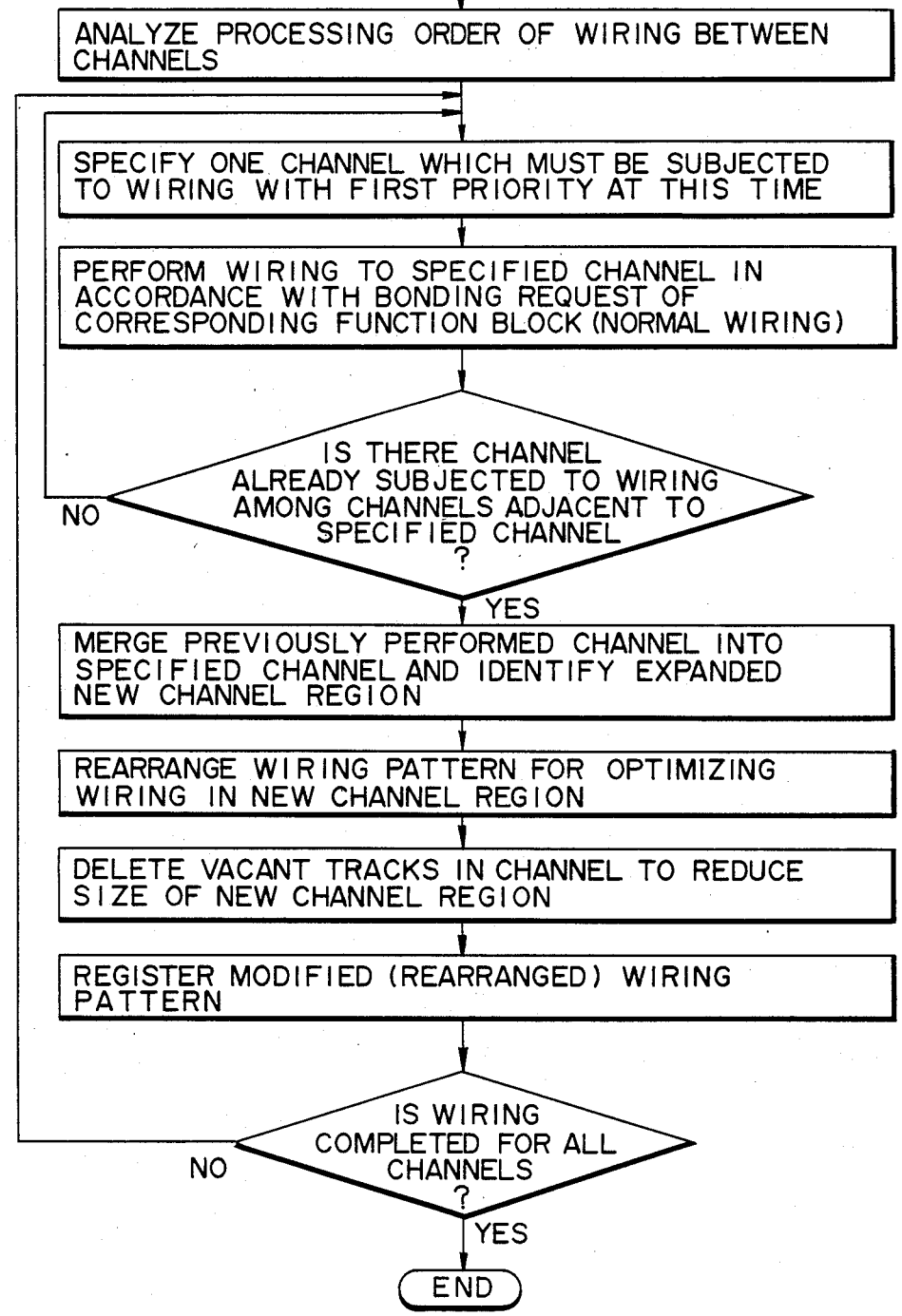
FIG. 2 is a flowchart of the main steps of the automatic wiring method of the present invention.

As shown in the flowchart shown in FIG. 2, a selected channel ("C6" in this example) is subjected to normal wiring first according to a bonding request. A wiring pattern, which is determined to satisfy the bonding request according to a desired LSI specification, consists of partial lines extending along a horizontal direction (X direction) and a vertical direction (Y direction) of substrate 10. The horizontal partial line is formed in, e.g., a lower conductive layer on substrate 10, and the vertical partial line is formed in an upper conductive layer insulatively stacked on the lower conductive layer. In order to constitute each connection line, the horizontal lines and the vertical lines are connected with each other through contact holes by a known method.

Merging Step with Adjacent Channel

After channel C6 is subjected to the above-mentioned normal wiring, it is checked or verified whether a channel already subjected to normal wiring is present among other channels adjacent to channel C6. If no such channel is present, another channel ("C5" in this example) having the next processing order, is subjected to normal wiring as indicated by arrow A1 in the flowchart of FIG. 2. After channel C5 is subjected to normal wiring, it is checked whether a channel already subjected to normal wiring is present among other channels adjacent to channel C5. In this case, since previously-subjected channel C6 is present, channels C6 and C5 are merged to define a new expanded channel region (designated by "C56"). This region corresponds to a T-shaped plane region located between blocks 18, 20, and 22 shown in FIG. 1.

In the above-mentioned channel merging, a channel to be merged is searched for from among channels, which are directly adjacent to the channel just subjected to the normal wiring, and which are already subjected to wiring. In other words, a channel to be merged with the channel just subjected to normal wiring is limited to the one having the processing order immediately before that of the above channel. For example, according to the example shown in FIG. 3, in merging which is executed immediately after channel C5 is subjected to wiring, a candidate of a channel to be merged with channel C5 is limited to channel C6 having the processing order immediately before that of channel C5. Although channels C4 and C7 are directly adjacent to channel C5, they are not merged therewith. Thus, an object to be merged can be relatively easily detected without using a complex method.

Wiring Pattern Rearrange Step for Optimization

The wiring patterns respectively designed for two independent channels C5 and C6 may be optimal in the respective channels but are not always optimal throughout new merged and expanded channel C56. For example, when a vacant space (an extra space), which does not contribute to wiring, is left in at least one of these channels, new expanded channel C56 can reduce the wiring pattern to remove the extra space, thereby reducing the area of new expanded channel C56. Even if partial wires are already drawn in channels C5 and C6 for the number corresponding to the number of tracks allowable for channels C5 and C6, the extra space can be removed from new merged channel C56. This is because a boundary (designated by "B4" in FIG. 1) between channels C5 and C6 is omitted. That is, in the normal wiring, since each boundary does not contribute to a count of an allowable track number in the corresponding channel, no wire is provided on the boundary which defines each channel. Therefore, if boundary B4 is omitted as a result of merging channels C5 and C6, a space corresponding to boundary B4 can serve as a space for transiting wires. As a result, partial wires can be allocated on boundary B4, and unnecessary tracks in new channel C56 can be erased in correspondence thereto, thereby reducing the area of channel C56. The wiring pattern in channel C56 thus modified (rearranged) is registered again to replace the original wiring patterns of channels C5 and C6.

When the postwiring processing (optimal wiring rearrangement processing), consisting of the above-presented basic steps described above, and is unique to the present invention, is completed, it is checked whether the wiring is completed for all channels C1 to C7 provided on substrate 10. If "No" in this step, the processing advances as indicated by line A2 of the flowchart in FIG. 2. That is, the channel among the residual channels (i.e., channels not yet subjected to wiring), which has the highest processing order according to the order shown in FIG. 3, is subjected to wiring and the postwiring processing in substanially the same manner as described above. When completion of wiring throughout channels C1 to C7 is confirmed, the automatic wiring process is completed.

Careful attention should be given to the fact that the new channel region absorbs adjacent channels and expands step by step by repeating the above-mentioned postwiring processing, and when wiring is completed for all the channels, it has expanded to occupy the entire surface of substrate 10 so as to include all channels C1 to C7. In other words, as the processing is repeated as indicated by lines A1 and A2 of the flowchart in FIG. 2, adjacent channels are merged in turn, thereby effectively removing extra spaces. Therefore, when wiring for the channel having the last wiring order is completed, all channels C1 to C7 are merged to define a new channel region. Accordingly, all boundaries between these channels are erased, and the most effective wiring pattern can be obtained for the entire upper surface of substrate 10.

Figure 4A:
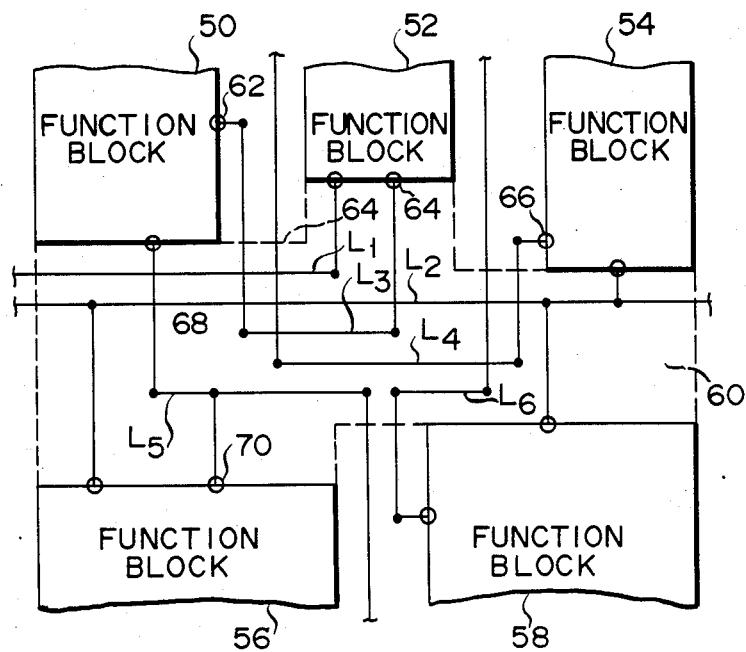
FIGS. 4A and 4B are diagrams showing changes in a wiring pattern on a substrate before and after adjacent channels are merged with each other, thereby presenting a typical example which can support the fact that an extra space can be effectively removed at a region newly defined by merging the adjacent channels when a post processing for optimal wiring rearrangement of the present invention is performed.
Figure 4B:
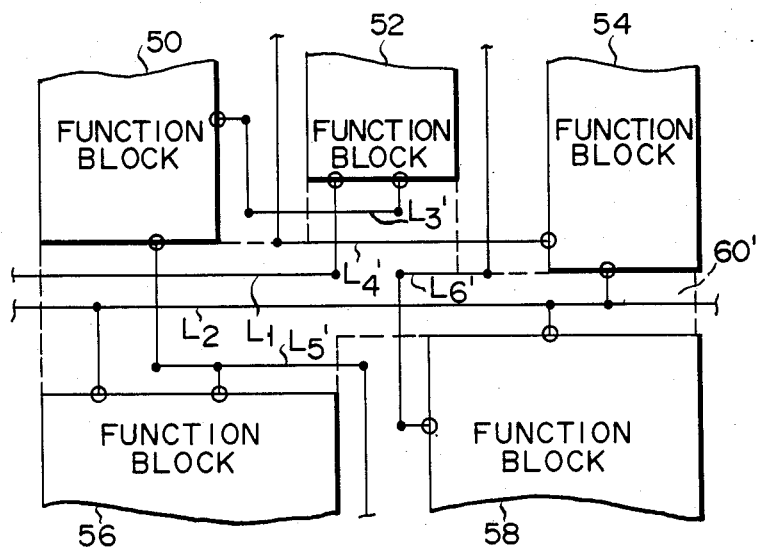

FIGS. 4A and 4B show typical examples which can support the fact that the extra spaces can be effectively removed in the new channel region, defined by performing the postwiring processing, for optimal wiring rearrangement according to the present invention and by merging adjacent channels. Two wiring pattern examples shown in FIGS. 4A and 4B do not directly correspond to the plan view of the embodiment shown in FIG. 1. However, they are similar to the above embodiment because their wiring patterns are automatically determined using the wiring method having the same concept as described above. In FIGS. 4A and 4B, boundaries which define channels around function blocks 50, 52, 54, 56, and 58 arranged on the chip substrate are indicated by broken lines as in FIG. 1. White circles are used to represent input/output terminals of the respective blocks, and black circles are used to denote contact holes for electrically connecting partial connecting lines extending along the X and Y direction. Note that in FIGS. 4A and 4B, outlines of substrate 10 are omitted for illustrative simplicity.

FIG. 4A shows the wiring pattern between the function blocks obtained immediately after execution of normal wiring which merely performs independent wiring to each channel in accordance with the processing order limitation (rule) described above with reference to FIG. 3. In this example, wiring at channel 60 is executed in accordance with the processing order limitation (rule) after wiring is executed at other channels surrounding channel 60. As is apparent from the illustration of FIG. 4A, although wiring at channel 60 completely satisfies the wiring request and conditions within the channel, it is not always the optimal and effective wiring pattern as a whole. For example, a connecting line for connecting terminal 62 at the right side of block 50 and terminal 64 at the lower side of block 52 utilizes third partial line (trunk) L3 of channel 60 and hence is not minimized as a whole. The reason why such a wiring pattern is determined by normal wiring is as follows. First, a drawing position for terminal 62 at the channel corresponding to block 60 is determined on boundary 64, indicated by a broken line. Thereafter, during wiring in channel 60, a proper trunk (i.e., "L3") is allocated in channel 60, in accordance with the above drawing position corresponding to terminal 62. A wire extending vertically between blocks 50 and 52 from terminal 66 at the left side of block 54 through trunk L4 of channel 60, and a wire connected to terminal 68 at the lower side of block 50 and terminal 70 at the upper side of block 56 and extending vertically between blocks 56 and 58 through trunk L5 of channel 60, are unnecessarily elongated wiring patterns for the same reason.

FIG. 4B shows a wiring pattern between blocks obtained as a result of the wiring optimization processing according to the present invention described above. As is apparent when compared with the wiring pattern shown in FIG. 4A, each channel of the wiring pattern shown in FIG. 4B is rearranged, i.e., reduced, so that the length of each wiring pattern as a whole and an extra space are minimized. That is, channel 60 is merged with channels surrounding channel 60 and is identified as new channel region 60' (note that in FIG. 4B, broken lines are still shown to indicate boundaries between channels so that visual comparison can be easily performed with respect to FIG. 4A). The wiring pattern is adjusted in new channel region 60' to optimally satisfy the wiring request and conditions (and hence corresponding blocks 56 and 58 are positionally adjusted in accordance therewith), thereby minimizing the extra spaces which correspond to unused tracks. For example, trunk L3 which serves as a part of a connecting line for connecting terminals 62 and 64 of blocks 50 and 52 is positionally adjusted to come close to block 52 as designated by "L3'" in FIG. 4B. As a result, according to the wiring pattern in FIG. 4B, of four tracks which define a height of channel 60 corresponding to a vertical distance between blocks 54 and 58 shown in FIG. 4A, three tracks occupied by trunks L3, L4, L5, and L6 can be erased (omitted), thereby reducing (arranging) the number of tracks to one for trunk L2. This means that the vertical distance between blocks 54 and 58 can be reduced and hence an LSI chip size can be reduced.

According to the embodiment of the present invention described above, normal wiring (i.e., a local wiring optimization processing) at each channel on the chip substrate is completed based on a channel wiring method capable of high speed processing, and then channel merging is added every time normal wiring is executed, thereby performing total wiring pattern optimization. Therefore, when wiring is completed at the last channel, wiring pattern optimization rearrangement is automatically performed substantially throughout the channel regions on the chip substrate, so that the effective wiring pattern which satisfies the LSI bonding request and eliminates vacant regions can be automatically determined on the minimized chip substrate at a high speed. This largely contributes to providing a uniform, maximum wiring density at each channel of a building block type or a general cell type semiconductor integrated circuit device. Therefore, the packing density of the semiconductor integrated circuit device of this type can be improved.

Although the invention has been described with reference to a specific embodiment, it should be understood by those skilled in the art that numerous modifications may be made within the spirit and scope of the inventive contribution. For example, the stage data processing at the data register mode of the above system is not limited to the picture compression processing described above, but may be other processing such as a processing for understanding a meaning of input data or a processing for extracting its content.

What is claimed is:

1. An automatic wiring method for a semiconductor integrated circuit device in which function blocks selected to obtain desired logical functions are arranged on a substrate and channels are defined around the function blocks to serve as wiring regions, said method comprising the steps of:
    (a) selecting a first channel from the channels on said substrate in accordance with a predetermined processing order;
    (b) performing routing/wiring processing to determine electrical connecting paths between associated function blocks in said first channel in accordance with a bonding request, thereby obtaining a normal wiring pattern;
    (c) detecting, after the routing/wiring processing is completed, a second channel which neighbors said first channel and has been already subjected to normal routing/wiring processing, said second channel having a processing order immediately before a processing order of said first channel;
    (d) merging said first and second channels to form a new third channel, the area of which is expanded, said third channel having a combined wiring pattern obtained by combining wiring patterns of said first and second channels;
    (e) performing wiring pattern rearranging to modify said combined wiring pattern of said third channel to matching with the shortest routing rule at an expanded space of said third channel; and (f) verifying whether a vacant space not contributing to wiring is left in the modified wiring pattern of said third channel, and if such a vacant space is detected, removing the vacant space to reduce the area of said third channel, thereby to optimize the entire wiring pattern of said integrated circuit device and maximize packing density of said integrated circuit device.

2. The method according to claim 1, further comprising:

(g) detecting, after the rearranging process is completed, a fourth channel which neighbors said third channel and has been already subjected to normal routing/wiring processing;

(h) merging said third and fourth channels to form a new fifth channel, the area of which is further expanded, said fifth channel having a combined wiring pattern obtained by combining wiring patterns of said third and fourth channels;

(i) performing wiring pattern rearranging to modify said combined wiring pattern of said fifth channel to match with the shortest routing rule at an expanded space of said fifth channel; and (j) verifying whether a vacant space not contributing to wiring is left in the modified wiring pattern of said fifth channel, and if such a vacant space is detected, removing the vacant space to reduce the area of said fifth channel.

3. The method according to claim 1, wherein said channels including said first and second channels extend along first and second directions perpendicular to each other on said substrate and are substantially defined by boundaries on which wiring is prohibited to be formed, and wherein the corresponding boundary or boundaries are removed from said combined wiring pattern of said third channel, thereby increasing spaces at the third channel where wires are allowed to extend.

4. The method according to claim 3, wherein each of said channels including said first and second channels has tracks defined along at least one of said first and second directions, and the number of said tracks corresponds to the number of wires allowed to extend therein.

5. The method according to claim 4, wherein, when said corresponding boundary or boundaries which separate said first and second channels are removed from said combined wiring pattern of said third channel newly defined by merging said first and second channels, a space of said third channel left at the position where said boundary is removed is allowed to serve as a new track.

6. The method according to claim 5, wherein said normal wiring processing executed to said first channel corresponds to local wiring optimization processing, and said pattern modification processing executed to said combined wiring pattern of said third channel corresponds to total wiring optimization processing.

7. The method according to claim 5, wherein said normal wiring processing and said pattern modification processing are repeatedly applied to channels sequentially specified in accordance with said processing order, so that when the pattern modification processing is executed at the last channel, modification has been performed to optimize the wiring pattern of the entire region of said substrate.

8. The method according to claim 7, wherein said function blocks are selected to include at least one of a memory unit and a calculation unit.

9. The method according to claim 8, wherein said memory unit is selected to include at least one of a random access memory and a read only memory.

10. The method according to claim 9, wherein said calculation unit is selected to include at least one of a programmable logic array, an arithmetic logic unit, and a central processing unit.

11. The method according to claim 7, wherein said function blocks comprise a polycell.

* * * * *